US012719267B2

(12) United States Patent
Davis et al.

(10) Patent No.: US 12,719,267 B2
(45) Date of Patent: Aug. 25, 2026

(54) DRAIN-BALLASTED ELECTROSTATIC DISCHARGE PROTECTION CIRCUITS

(71) Applicant: Micron Technology, Inc., Boise, ID (US)

(72) Inventors: James E. Davis, Boise, ID (US); Michael D. Chaine, Boise, ID (US); Gregory A. King, Mankato, MN (US); Liuchun Cai, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 194 days.

(21) Appl. No.: 18/647,962

(22) Filed: Apr. 26, 2024

(65) Prior Publication Data

US 2024/0372360 A1 Nov. 7, 2024

Related U.S. Application Data

(60) Provisional application No. 63/463,231, filed on May 1, 2023.

(51) Int. Cl.
*H02H 9/04* (2006.01)
*G11C 5/14* (2006.01)

(52) U.S. Cl.
CPC ............. *H02H 9/046* (2013.01); *G11C 5/145* (2013.01)

(58) Field of Classification Search
CPC .......... G11C 5/145; G11C 11/34; H02H 9/00; H02H 9/005; H02H 9/02; H02H 9/025; H02H 9/046; H02H 9/047
USPC .......................................................... 361/56
See application file for complete search history.

(56) References Cited

U.S. PATENT DOCUMENTS 6,947,267 B2 * 9/2005 Liu ...................... H10D 89/819 361/111
9,716,087 B1 7/2017 Huang et al.
9,748,222 B2 8/2017 Chen et al.
10,032,764 B2 7/2018 Lin et al.
2009/0122451 A1 * 5/2009 Lin ...................... H10D 89/811 361/56
2010/0296213 A1 * 11/2010 Lee .......................... H02H 9/04 361/111
2015/0194418 A1 * 7/2015 Bade .................... H10D 89/601 361/56
2021/0397773 A1 * 12/2021 Chen ...................... G06N 3/063

* cited by examiner

*Primary Examiner* — Kevin J Comber
(74) *Attorney, Agent, or Firm* — Brooks, Cameron & Huebsch, PLLC

(57) ABSTRACT

An apparatus includes a first voltage domain including a first circuit configured to operate at a first supply voltage, a second voltage domain including second circuit configured to operate at a second supply voltage, and a drain-ballasted electrostatic discharge (ESD) protection circuit configured to electrically couple the first voltage domain and the second voltage domain, the drain-ballasted ESD protection circuit including a first NMOS transistor, a second NMOS transistor, a floating interconnect that electrically couples the first NMOS transistor to the second NMOS transistor, and a grounding resistor coupled to the first NMOS transistor and the second NMOS transistor.

19 Claims, 5 Drawing Sheets

DRAIN-BALLASTED ELECTROSTATIC DISCHARGE PROTECTION CIRCUITS

PRIORITY INFORMATION

This application claims the benefits of U.S. Provisional Application No. 63/463,231, filed on May 1, 2023, the contents of which are incorporated herein by reference.

TECHNICAL FIELD

Embodiments of the disclosure relate generally to memory systems, and more specifically, relate to drain-ballasted electrostatic discharge protection circuits.

BACKGROUND

A memory system can include one or more memory devices that store data. The memory devices can be, for example, non-volatile memory devices and volatile memory devices. In general, a host system can utilize a memory system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
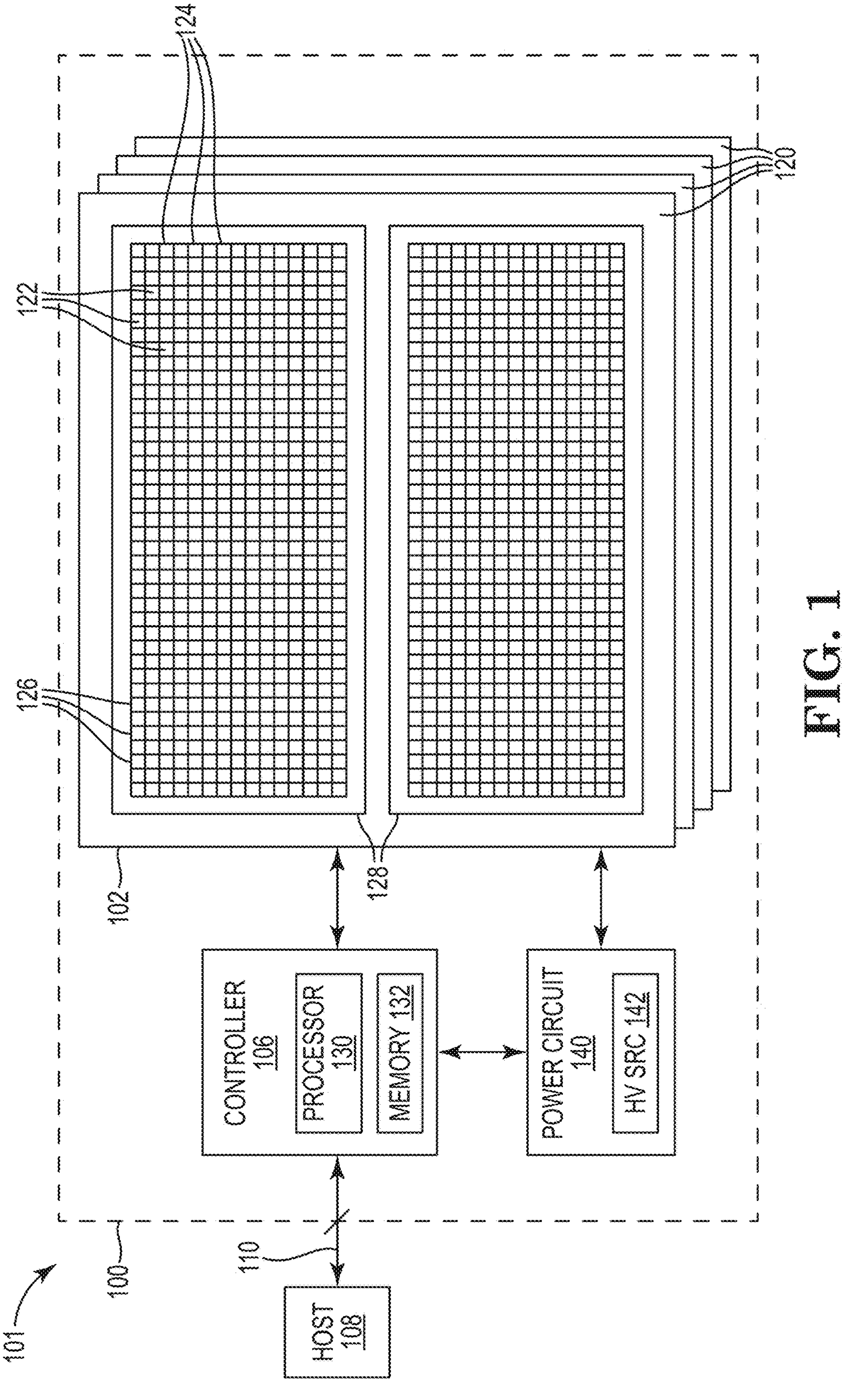
FIG. 1 illustrates an example memory system configured in accordance with some embodiments of the present disclosure.

Aspects of the present disclosure are directed to drain-ballasted electrostatic discharge protection circuits and, in particular to memory systems (e.g., memory sub-systems) that include a drain-ballasted electrostatic discharge protection circuit. The drain-ballasted electrostatic discharge protection circuit may also be referred to as "drain-ballasted electrostatic discharge protection circuitry" herein. As used herein, a drain-ballasted electrostatic discharge protection circuit refers to a circuit with a grounding resistor that is electrically coupled to back to back n-type metal-oxide-semiconductor (NMOS) transistors to increase the electrical resistance of each of the respective drains of the NMOS transistors.

For instance, the drain-ballasted electrostatic discharge protection circuit may include a first NMOS transistor, a second NMOS transistor, a floating interconnect to electrically couple the first NMOS transistor to the second NMOS transistor, and a grounding resistor coupled to the first NMOS transistor (e.g., to a first gate of a NMOS transistor) and the second NMOS transistor (e.g., to a second gate of a NMOS transistor), as described herein. In some embodiments, the NMOS transistor can be fin field-effect transistor (FinFET) such as a n-type FinFET. That is, the present disclosure has unexpectedly discovered that the drain-ballasted electrostatic discharge protection circuits herein can successfully mitigate ESD events in memory devices employing FinFETs (e.g., n-type FinFETs), as is described herein.

The drain-ballasted electrostatic discharge protection circuits herein may be electrically coupled to a plurality of voltage domains. As used herein, a voltage domain refers to a memory device or a portion of a memory device configured to operate at a given voltage (e.g., a given supply voltage). Each voltage domain may have a different set of power bonding pads (e.g., a power pin) and ground bonding pads (e.g., a ground pin). For example, some integrated circuits (ICs) may include a first voltage domain and a second voltage domain. The first voltage domain may include circuitry that is configured to operate at a first voltage level (e.g., a first supply voltage) while other circuitry in the second voltage domain may be configured to operate at a second voltage level (e.g., a second supply voltage) that is different than the first voltage level.

The voltage domains may be included in various types of electronic devices such as those deployed as computing sub-systems, system-on-a-chip, artificial intelligence/neural networks, data collection and/or data processing devices, and/or memory systems, among others. For instance, the voltage domains can be included in one or more memory resources that are associated with the memory system. A memory system (e.g., memory sub-system) can be a storage system, storage device, a memory module, or a combination of such. An example of a memory sub-system is a storage system such as a solid-state drive (SSD). Examples of storage devices and memory modules are described below in conjunction with FIG. 1, et alibi. While the concepts are described herein in some instances with respect to a memory system, the drain-ballasted electrostatic discharge protection circuits herein may be employed in various other types of electronic devices that include voltage domains.

In general, a host system can utilize a memory sub-system that includes one or more components, such as memory devices that store data. The host system can provide data to be stored at the memory sub-system and can request data to be retrieved from the memory sub-system. For instance, during operation of a computing system, data may be written to, and retrieved from the memory sub-system. Some data may be written to persistent memory devices (which can be analogous to or similar to "non-volatile memory" devices) within the memory sub-system for long-term storage, while other data may be written to non-persistent memory devices (which can be analogous to or similar to "volatile" memory devices) within the memory sub-system for quick, short-term retrieval. Still other data may be written to various memory resources and/or caches of the memory sub-system to assist with performance of operations involving the memory sub-system.

For example, various memory resources and/or caches can be utilized during operation of the memory sub-system to provide read caching, write-through caching, write-back caching, and/or write-around caching. In addition, some memory resources and/or caches of the memory sub-system can be allocated to store various tables that are utilized during operation of the memory sub-system. One such example is a logical-to-physical (L2P) table that is used to map logical addresses utilized by a host system to physical addresses of the memory sub-system where data is physically stored. Another such example is a database containing an organized collection of data that is stored within the memory resource and/or cache.

Ics may experience electrostatic discharge (ESD) events. An ESD event refers to a sudden and momentary electric current caused by an imbalance of electric charge. An ESD event may cause damage to integrated circuits. In particular, metal-oxide semiconductor field-effect transistors (MOSFETs), which are prevalent in Ics may be particularly vulnerable to damage due to the thin gate oxide used in the MOSFETs. Furthermore, as device sizes shrink the vulnerability of integrated circuits to damage from ESD events may be increased.

For instance, an ESD event may involve the discharge of positive charges, "positive ESD", or a discharge of negative charges, "negative ESD". Charge from the ESD event is looking for the quickest or most conductive path. In some instances, the quickest path may be between separate voltage domains. For example, a power pin in a first voltage domain (e.g., a first power domain) may become electrically coupled to a power pin in a different voltage domain (e.g., a second voltage domain) such that cross-domain charge flow occurs between the power pins during an ESD event. As a result, various internal circuits (e.g., gate oxides of Ics) along the path in the separate voltage domains and/or interfaces between the separate voltage domains may be damaged.

Accordingly, some approaches seek to provide an alternative path for the ESD current to pass through that is more conductive than other paths (e.g., through sensitive electronic components) so that the sensitive electronic components are protected from the ESD. For instance, some approaches may employ a diode ("ESD diode"), which has the benefit of providing a conductive path in only one direction (e.g., the forward direction) while providing electrical isolation in the other direction (e.g., in the reverse direction). For instance, such approaches may employ a series of diodes that are connected in opposing directions to mitigate some of the negative impacts of ESD events.

However, as mentioned such approaches may be unidirectional (e.g., may be intended to primarily protect from ESD event initiating in a particular voltage domain). Thus, such approaches may not mitigate effects of ESD events that propagate in a direction other than the individual direction that the diodes are intended to protect. Further, such approaches may (e.g., depending on a degree of diode doping, a quantity of diodes, and/or a magnitude of a particular ESD event, etc.) undesirably exhibit a relatively large "overshoot" effect during an ESD event. The "overshoot" effect may correspond to a period of time during which charge from the ESD event propagates in an unintended manner and therefore may result in damage. Further still, such approaches may exhibit a relatively high turn-on (e.g., initiation) voltage at which the diodes may start to mitigate the negative impacts of the ESD event. Thus, due to the relatively large "overshoot" and/or relatively high initiation voltage, such approaches may expose the internal circuits, at least initially during an ESD event, to voltage levels that may damage the internal circuits (e.g., may damage gate oxide of a CMOS).

Moreover, as higher voltage domains (e.g., having a supply voltage of 1.8 volts or higher) are employed in Ics such approaches may not be readily scaled for use with the higher voltage domains. For instance, to provide a suitable degree of ESD protection such approaches may employ a large quantity of diodes. As a result, the diode based ESD device may have at least one dimension that is large (e.g., larger than 50 micrometers (μm), larger than 100 μm, and/or larger than 140 μm). Thus, the diode-based ESD device may increase a relative size of the resultant end device (e.g., an IC) and/or may occupy a disproportionate amount of space on the IC thereby reducing an amount of space for other circuitry such as memory devices on the IC. Such inefficient use of space can therefore reduce the overall performance of an IC in which such methodologies are employed.

To address the above and other deficiencies, approaches herein employ a drain-ballasted electrostatic discharge protection circuit that is configured to electrically couple a first voltage domain and a second voltage domain, as described herein. Unlike the previous approaches such as those described above, the drain-ballasted electrostatic discharge protection circuits herein are bi-directional, may exhibit relatively minimal or no "overshoot" effect, may have a low initiation voltage, and may occupy a relatively small amount of area. As such, the drain-ballasted electrostatic discharge protection circuits herein are suitable for use in higher voltage domains (e.g., having a supply voltage of 1.8 volts or higher). In view of the above, embodiments described herein employing drain-ballasted electrostatic discharge protection circuits can mitigate an impact of an ESD event even across higher power voltage domains and can therefore yield enhanced overall performance of a computing system in which such methodologies are employed.

In the interest of clarity, embodiments herein will be generally described in relation to circuitry having a given quantity of voltage domains (e.g., two voltage domains), however, it will be appreciated that embodiments in which a different quantity of voltage domains are contemplated within the scope of the disclosure. In the interest of clarity, embodiments herein will be generally described in relation to a memory device, however, it will be appreciated that embodiments in which a cache is utilized are contemplated within the scope of the disclosure.

FIG. 1 is a block diagram of a system 101 having a memory device 100 configured in accordance with some embodiments of the present disclosure. As shown, the memory device 100 includes a main memory 102 (e.g., NAND flash, NOR flash, chalcogenide PCM, etc.) and a controller 106 operably coupling the main memory 102 to a host device 108 (e.g., an upstream central processor (CPU)).

The main memory 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages.

The memory cells 122 can include, for example, floating gate, charge trap, phase change, ferroelectric, magnetoresistive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Each word line can include one or more memory pages, depending upon the number of data states the memory cells 122 of that word line are configured to store. For example, a single word line of memory cells 122 in which each memory cell 122 is configured to store one of two data states (e.g., SLC memory cells configured to store one bit each) can include a single memory page. Alternatively, a single word line of memory cells 122 in which each memory cell 122 is configured to store one of four data states (e.g., MLC memory cells configured to store two bits each) can include two memory pages. Moreover, memory pages can be interleaved so that a word line comprised of memory cells 122 in which each memory cell 122 is configured to store one of two data states (e.g., SLC memory cells) can span two memory pages, in an "even-odd bit line architecture," where all the memory cells 122 in odd-numbered columns 126 of a single word line are grouped as a first memory page, and all the memory cells 122 in even-numbered columns 126 of the same word line are grouped as a second memory page. When even-odd bit line architecture is utilized in a word line of memory cells 122 in which each memory cell 122 is configured to store larger numbers of data states (e.g., memory cells configured as MLC, TLC, QLC, etc.), the number of memory pages per word line can be even higher (e.g., 4, 6, 8, etc.)

Each column 126 can include a string of series-coupled memory cells 122 connected to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of hierarchies and/or groups than those shown in the illustrated embodiments. For instance, in some embodiments the memory cells 122 can be configured as or include FinFET with a semiconductor fin that is covered by a gate. Channel regions of the FinFET are formed within the fins at the intersections between the gate conductors and the fins. For instance, the FinFET can be a n-type FinFET or a p-type FinFET.

Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 100 can include only one memory unit 120.

Alternatively, the memory device 100 can include 2, 3, 4, 8, 10, or more (e.g., 16, 32, 64, or more) memory units 120. Although the memory units 120 are shown in FIG. 1 as including two memory blocks 128 each, in other embodiments, each memory unit 120 can include 1, 3, 4, 8, or more (e.g., 16, 32, 64, 100, 128, 256, or more memory blocks). In some embodiments, each memory block 128 can include, for example, 215 memory pages, and each memory page within a block can include, for example, 212 memory cells 122 (e.g., a "4k" page).

The controller 106 can be a microcontroller, special purpose logic circuitry (e.g., a field programmable gate array (FPGA), an application specific integrated circuit (ASIC), etc.), or other type of suitable processor. The controller 106 can include a processor 130 configured to execute instructions stored in memory.

In the illustrated example, the memory of the controller 106 includes an embedded memory 132 configured to perform various processes, logic flows, and routines for controlling operation of the memory device 100, including managing the main memory 102 and handling communications between the memory device 100 and the host device 108. In some embodiments, the embedded memory 132 can include memory registers storing, for example, memory pointers, fetched data, etc. The embedded memory 132 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 1, a memory device 100 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the main memory 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 1).

The controller 106 and/or the main memory 102 can be coupled to a power circuit 140 configured to provide power used during operation. The power circuit 140 can provide lower voltages (e.g., below 5V) and/or higher voltages (e.g., greater than 5V) to different circuits/domains. For example, the power circuit 140 can include a circuit to provide the lower voltages for reading the memory regions and/or for executing internal operations. Also, the power circuit 140 can include a high voltage source 142 configured to provide the higher voltages for programming the memory regions.

The controller 106 communicates with the host device 108 over a host-device interface 110. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 108 can be any one of a number of electronic devices capable of utilizing memory for the temporary or persistent storage of information, or a component thereof. For example, host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 108 may be a networking device (e.g., a switch, a router, etc.) or a recorder of digital images, audio and/or video, a vehicle, an appliance, a toy, or any one of a number of other products. In one embodiment, host device 108 may be connected directly to memory device 100, although in other embodiments, host device 108 may be indirectly connected to memory device 100 (e.g., over a networked connection or through intermediary devices).

Figure 2:
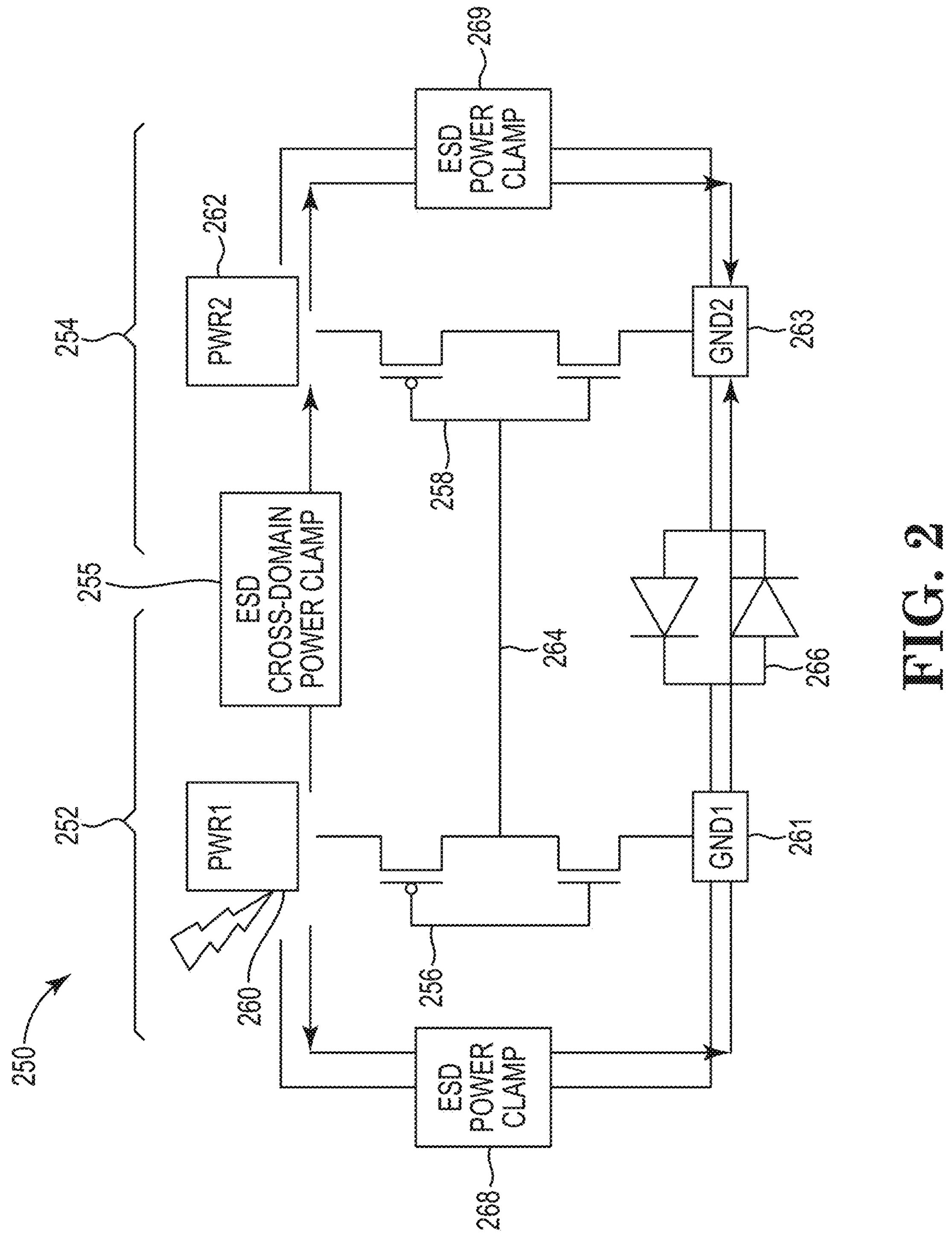
FIG. 2 illustrates a circuit diagram including an example drain-ballasted electrostatic discharge protection circuit in accordance with some embodiments of the present disclosure.

FIG. 2 illustrates a circuit diagram 250 including an example drain-ballasted electrostatic discharge protection circuit 255 in accordance with some embodiments of the present disclosure. As illustrated in FIG. 2, the circuit diagram includes two different voltage domains (e.g., two different power domains) represented as a first voltage domain 252 and a second voltage domain 254.

Each voltage domain can include respective I/O circuitry (e.g., pins) such as a respective power pin and a respective ground pin. For instance, the first voltage domain 252 can include a first power pin (represented by element 260) configured to supply a first supply voltage and a first ground pin (represented by element 261). Similarly, the second voltage domain 254 can include a second power pin (represented by element 262) configured to supply a second supply voltage and a second ground pin (represented by element 263).

In some embodiments, the first supply voltage and the second supply voltage are not substantially equal (e.g., the first supply voltage and the second supply voltage are different). For instance, in some embodiments the first supply voltage may be less than the second supply voltage. In some embodiments, at least one of the voltage domains may be a high voltage domain having a voltage (supply voltage) of at least 1.8 volts or higher. For instance, the first supply voltage may be in a range from 0.8 volts to 1.2 volts, and the second supply voltage may be in a range from 1.8 to 2.4 volts, among other possible values.

In some embodiments, the first supply voltage may be substantially equal to 1.2 volts and the second supply voltage may be substantially equal to 1.8 volts. As used herein, the term "substantially" intends that the characteristic need not be absolute, but is close enough so as to achieve the advantages of the characteristic. For example, a supply voltage being "substantially equal" to a particular value is not limited to absolute values. For instance, continuing with the above examples a value of the first supply voltage can be within 0.5%, 1%, 2%, 5%, or 10%, etc. of the 1.2 volts and the similarly a value of the second supply voltage can be within 0.5%, 1%, 2%, 5%, or 10%, etc. of the 2.4 volts.

As mentioned, in some embodiments the different voltage domains may include components configured to operate at different supply voltages. For instance, the first voltage domain 252 may include a first circuit 256 that is configured to operate at a first supply voltage and the second voltage domain 254 may include a second circuit 258 that is configured to operate at a second supply voltage that is different than the first supply voltage.

However, as detailed herein, in some embodiments the voltages of the different voltage domains may be configured to operate with overlapping supply voltage ranges or may be configured to operate at substantially equal supply voltages, as described herein. For instance, the separate voltage domains may be configured to operate at substantially equal supply voltages (substantially equal in potential) but may include respective circuitry defining the separate voltage domains. For example, the first supply voltage may be substantially equal to 1.8 volts and the second supply voltage may be substantially equal to 1.8 volts. Similarly, in some embodiments the first supply voltage may be substantially equal to 2.4 volts and the second supply voltage may be substantially equal to 2.4 volts, among other possibilities.

In some embodiments, the first circuit 256 and the second circuit 258 may be planar complementary metal-oxide-semiconductor) CMOS circuits. However, in some embodiments the first circuit 256 and the second circuit 258 may be non-planar (e.g., three-dimensional) FinFETs. For instance, the first circuit 256 can be a first FinFET and the second circuit 258 can be a second FinFET. In such embodiments, the first FinFET may be electrically coupled to the first power pin 260 and the first ground pin 261 the second FinFET may be electrically coupled to the second power pin 262 and the second ground pin 263. The first FinFET and the second FinFET can be the same type of FinFET. For instance, the first circuit 256 may be a first n-type FinFET and the second circuit 258 may be a second n-type FinFET. However, in some embodiments, the first circuit 256 may be a first p-type FinFET and the second circuit 258 may be a second p-type FinFET.

In some embodiments, the first circuit 256 may be electrically coupled to the second circuit 258 via interface circuitry 264, as is illustrated in FIG. 2. Examples of the interface circuitry 264 includes traces, buses, and/or other types of interface circuitry configurable to electrically couple the first circuit 256 to the second circuit 258. In the absence of the drain-ballasted ESD protection circuit 255 ("ESD CROSS-DOMAIN POWER CLAMP"), the interface circuitry 264 may permit charge to flow between the first power pin 260 and the second ground pin 263 and/or between the second power pin 262 and the first ground pin 261 during an ESD event. That is, charge from an ESD event may flow via the interface circuitry 264 through the first circuit 256 and/or the second circuit 258 and thereby damage the first circuit 256 and/or the second circuit 258.

Accordingly, in some embodiments the drain-ballasted ESD protection circuit 255 may be configured to electrically couple the first voltage domain 252 and the second voltage domain 254. For instance, the drain-ballasted ESD protection circuit 255 may be configured to electrically couple the first power pin 260 included in the first voltage domain 252 to the second power pin 262 included in the second voltage domain 254. Electrically coupling the first power pin 260 to the second power pin provides an alternative cross-voltage domain path over which charge can flow during an ESD event. For instance, during an ESD event (represented by the lightning symbol) involving the first power pin 260, charge can flow along a path extending from the first power pin 260 via the drain-ballasted ESD protection circuit 255 and the second ESD power clamp 269 to the second ground pin 263, as illustrated in FIG. 2. Thus, at least a portion of the charge from an ESD event can flow along a path that does not extend through the circuits such as the first circuit 256 and the second circuit 258 to avoid any damage thereto.

In some embodiments, the drain-ballasted ESD protection circuit 255 may be configured to electrically couple the first voltage domain 252 and the second voltage domain 254 responsive to detection of a triggering condition. As used herein, a triggering condition refers to the detection of a value and/or rate of change in a value that satisfies (e.g., meets or exceeds a triggering threshold). Thus, the occurrence of the triggering condition may be indicative of an occurrence (e.g., initiation of) an ESD event. For instance, in some embodiments the triggering condition may be detection of a voltage that satisfies a threshold voltage, detection of a threshold voltage duration, and/or detection of a threshold rate of change in the voltage. Stated differently, the triggering condition may be indicative of an occurrence of an ESD event, and the triggering condition may be a detected voltage that satisfies a threshold voltage, may be a detected voltage duration that satisfies a threshold voltage duration, may be a detected rate of voltage change that satisfies a threshold rate of change in the voltage, or may be any combination thereof.

Figure 3:
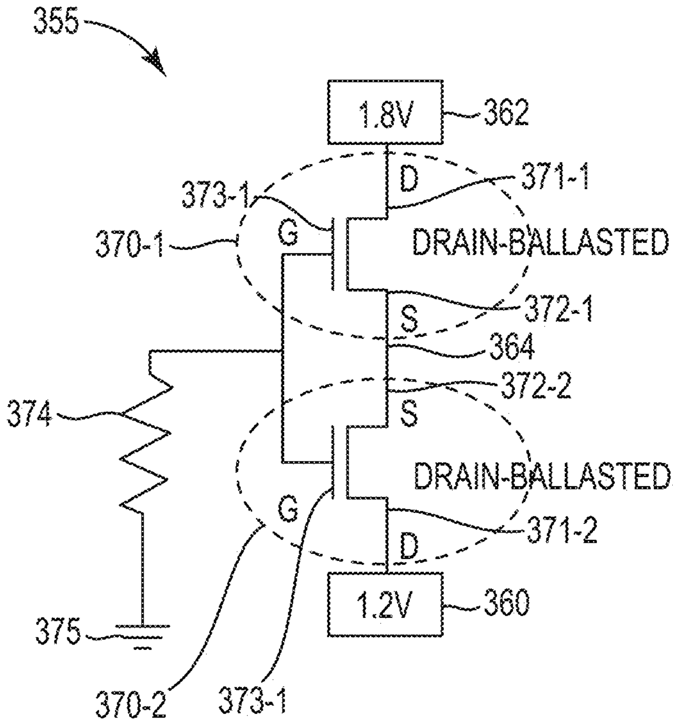
FIG. 3 illustrates a circuit diagram of an example drain-ballasted electrostatic discharge protection circuit in accordance with some embodiments of the present disclosure.

In some embodiments, the drain-ballasted ESD protection circuit 255 may be configured to electrically couple the first power pin 260 to the second power pin 262, electrically couple the first power pin 260 to the second ground pin 263, and/or electrically couple the second power pin 262 to the first ground pin 261 responsive to detection of a triggering condition. For instance, the drain-ballasted ESD protection circuit 255 can be configured to electrically couple the first power pin 260 to the second power pin 262 responsive to detection of the triggering event. In this way, the drain-ballasted ESD protection circuit 255 can temporarily (e.g., during an ESD event) provide a voltage path (e.g., between the first power pin 260 in the first voltage domain 252 and the second power pin 262 in the second voltage domain 254) during an ESD event to mitigate any voltage/current that may, in the absence of the drain-ballasted ESD protection circuit 255, otherwise pass along the interface circuitry 264 through a first circuit 256 and/or a second circuit 258. For instance, in some embodiments, the interface circuitry 264 may be a floating interconnection configured to electrically couple a first source (e.g., the first source 372-1, as illustrated in FIG. 3) to a second source (e.g., the second source 372-2, as illustrated in FIG. 3) directly (e.g., directly in series). Thus, the drain-ballasted ESD protection circuit 255 can be configured to provide bi-directional ESD protection regardless of whether an ESD event initiates from the first voltage domain 252 or from the second voltage domain 254.

In some embodiments, the drain-ballasted ESD protection circuit 255 may be configured to electrically isolate at least a portion of the first voltage domain 252 from at least a portion of the second voltage domain 254 in the absence of detection of a triggering condition. For example, the drain-ballasted ESD protection circuit 255 may be configured to electrically isolate the first power pin 260 of the first voltage domain 252 and the second power pin 262 of the second voltage domain 254 in the absence of detection of a triggering condition. Thus, charge (voltage/current) may be permitted to flow within the respective voltage domains along the typical operational paths (e.g., through the first circuit 256 between the first power pin 260 to the second ground pin 263) but may not be routed between the first power pin 260 and the second power pin 262 in the absence of an ESD event (e.g., in the absence of detection of a triggering condition).

Each voltage domain may have an independent power-rail ESD clamp circuit (i.e., a ESD power clamp). For instance, the first voltage domain 252 may include a first ESD power clamp 268 and the second voltage domain 254 may include a second ESD power clamp 269, as illustrated in FIG. 2. Examples of suitable ESD power clamps include a gate grounded NMOS (GGNMOS) and/or a silicon-controlled rectifier (SCR), among other types of ESD power clamps. In some embodiments, the first ESD power clamp 268 may be electrically coupled to the first power pin 260 and the first ground pin 261 and the second ESD power clamp 269 may be electrically coupled to the second power pin 262 and the second ground pin 263. Thus, the first power clamp 268 and the second ESD power clamp 269 can be configured to provide ESD protection to the first voltage domain 252 and the second voltage domain 254, respectively.

The ground pins of the voltage domains may be coupled via a series of diodes 266. For instance, the first ground pin 261 may be electrically coupled via the series of diodes 266 to the second ground pin 263. Thus, the series of diodes in conjunction with the power ESD power clamps can conduct the ESD currents under cross-power-domain ESD stresses between the first ground pin 261 and the second ground pin 263. In some embodiments, the series of diodes may be a series of back to back diodes, among other possibilities.

In some embodiments, the drain-ballasted ESD protection circuit 255 may include a trigger circuit configured to control the operating modes of the drain-ballasted ESD protection circuit 255. In some embodiments, the trigger circuit can include a transistor (e.g., a MOSFET device, such as a super-high voltage protection (SHVP) device) and a tuning circuit (e.g., an RC circuit) configured to detect ESD events. The trigger transistor can include a first terminal (e.g., a source) connected to a corresponding voltage domain and a second terminal (e.g., a drain) connected to the drain-ballasted ESD protection circuit 255. A control terminal (e.g., a gate) of the trigger transistor can be connected to a tuning circuit. The tuning circuit can include a resistor (e.g., poly) that is connected to ground on one end and connected to a capacitor (e.g., metal fringe) and the gate of the trigger transistor on the other end. The opposite terminal of the capacitor can be connected to a voltage domain. RC values can be predetermined to define the triggering ESD conditions, such as a voltage threshold, a duration threshold, a slew rate for the change in voltage, etc. As such, the drain-ballasted ESD protection circuit 255 can remain off (e.g., open circuit) during normal operations with a default-on-gate configuration using the SHVP device, but can be turned on during an ESD event.

FIG. 3 illustrates a circuit diagram of an example drain-ballasted ESD protection circuit 355 in accordance with some embodiments of the present disclosure. As illustrated in FIG. 3, the drain-ballasted ESD protection circuit 355 may include a first NMOS transistor 370-1, a second NMOS transistor 370-2, a floating interconnect 364 that may electrically couple the first NMOS transistor 370-1 to the second NMOS transistor 370-2. The drain-ballasted ESD protection circuit 355 may further include a grounding resistor 374 that may be coupled to the first NMOS transistor 370-1, the second NMOS transistor 370-2, and an electrical ground 375.

The first NMOS transistor 370-1 can include a gate 373-1 (e.g., which also referred to herein as a first gate), a drain-ballasted region as referred to herein as a drain 371-1 (e.g., a first drain), and a source region as referred to herein as a source 372-1 (e.g., a first source). Similarly, the second NMOS transistor 370-2 can include a gate 373-2 (e.g., a second gate), a drain-ballasted region as referred to herein as a drain 371-2 (e.g., a second drain), and a source region as referred to herein as a source 372-2 (e.g., a second source). As illustrated in FIG. 3, the drains 371-1, 371-2 of the drain-ballasted ESD protection circuit 355 can be proximate (e.g., more proximate than the sources 372-1, 372-2) to the power pins such as the first power pin 360 and the second power pin 362.

The second NMOS transistor 370-2 may be coupled in series with the first NMOS transistor 370-1, as illustrated in FIG. 3. For instance, a node represented by the floating interconnect 364 may be configured to electrically couple the first source 372-1 of the first NMOS transistor 370-1 to the second source 372-2 of the second NMOS transistor 370-2. Stated differently, the first NMOS transistor 370-1 can be configured in asymmetric manner with the second NMOS transistor 370-2. At least due to the asymmetric configuration of the NMOS transistors the drain-ballasted ESD protection circuit 355 can be configured to provide bi-directional ESD protection regardless of whether an ESD event initiates from the first voltage domain (e.g., the first voltage domain 252) or from the second voltage domain (e.g., the second voltage domain 254).

As used herein, the floating interconnect refers to a circuit or trace that floats (e.g., is not directly coupled to a power pin or ground pin) and thereby permits the first source of the first NMOS transistor to the second source 372-2 of the second NMOS transistor 370-2. As used herein, a gate coupling effect refers to the gate coupling exhibiting by the grounding resistor 374. In the context of ESD protection, the gate coupling effect may desirably permit the drain-ballasted ESD protection circuit 355 to be relatively small and yet still exhibit suitable ESD performance. In particular, it has been observed that the drain-ballasted ESD protection circuits herein due to the gate coupling effect and/or added drain resistance when employed with FinFETs desirably causes uniform device activation (e.g., uniform activation of each finger in a FinFET device during an ESD event) and thereby yields a more robust memory device that is less prone to damage from ESD events.

The grounding resistor 374 may be electrically coupled to the first NMOS transistor 370-1 and the second NMOS transistor 370-2. For instance, the grounding resistor 374 may be electrically coupled to the first gate 373-1 of the first NMOS transistor 370-1 and the second gate 373-2 of the second NMOS transistor, as illustrated in FIG. 3. Having the grounding resistor 374 coupled to the first gate 373-1 of the first NMOS transistor 370-1 and the second gate 373-2 of the second NMOS transistor may result in the ballasting (increase of the resistance) of the first drain 371-1 and the second drain 371-2 and thereby promote aspects herein such as maintaining a relatively small drain-ballasted ESD protection circuit that still effectively protects the circuits (e.g., the first circuit and the second circuit) from damage due to ESD events.

In some embodiments, the grounding resistor 374 may be formed of polysilicon and/or other high ohmic material. In some embodiments, the grounding resistor 374 may have a resistance that is equal to or greater than 10,000 ohms. Having a resistance that is equal to or greater than 10,000 ohms can yield a resultant ESD protection circuit 355 with sufficient resistance (e.g., sufficient drain-ballasted resistance) to mitigate any effects from ESD events, even at higher supply voltages (e.g., 1.8 V or higher). The grounding resistor 374 may be configured as described herein to ensure that the ESD protection circuit 355 remains off during normal operation (e.g., in the absence of an ESD event) and also to permit a gate coupling effect, for instance, associated with a "turn on effect" of the first NMOS transistor 370-1 and a "turn on effect" of the second NMOS transistor that may result in the ballasting (increase of the resistance) of the first drain 371-1 and the second drain 371-2 and thereby promote aspects herein such as maintaining a relatively small drain-ballasted ESD protection circuit that still effectively protects the circuits (e.g., the first circuit and the second circuit) from damage due to ESD events.

Figure 4:
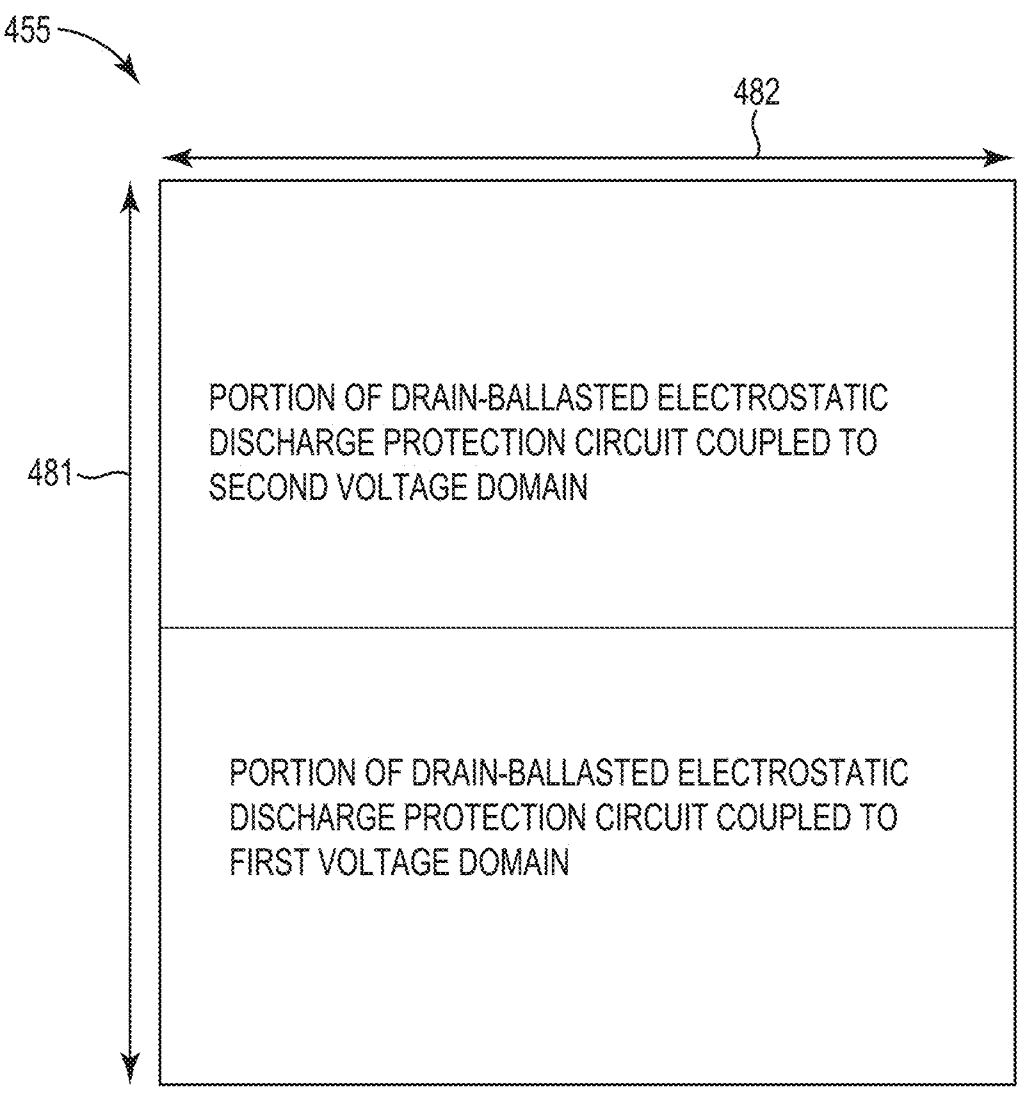
FIG. 4 illustrates a representation of an example drain-ballasted electrostatic discharge protection circuit in accordance with some embodiments of the present disclosure.

FIG. 4 illustrates a representation of an example drain-ballasted ESD protection circuit 480 in accordance with some embodiments of the present disclosure. As mentioned, the drain-ballasted electrostatic discharge protection circuits herein are bi-directional, may exhibit relatively no or minimal "overshoot" effect, may have a low initiation voltage, may occupy a relatively small amount of area, and yet may be suitable for use in high voltage domains.

For instance, the drain-ballasted ESD protection circuit 455 can have a first physical dimension 481 (e.g., a vertical dimension) and a second physical dimension 482 (e.g., a horizontal dimension) that are each smaller than corresponding dimensions in a comparative back-to-back diode based protection circuitry that is configured for operation in higher voltage domains (e.g., those with a supply voltage of 1.8 volts or higher). The first physical dimension can be comprised of a portion of the drain-ballasted ESD protection circuit that is coupled to (e.g., included in) the first voltage domain and a portion of the drain-ballasted ESD protection circuit that is coupled to the second voltage domain. The second dimension can be comprised of a respective width of one or both of the portions of the drain-ballasted ESD protection circuit that are coupled to the first voltage domain and the second voltage domain. In some instances, the second dimension can be equal to a width of both of the portions of the drain-ballasted ESD protection circuit that are coupled to the first voltage domain and the second voltage domain. Notably, the second dimension can be an order of approximately three times smaller than a corresponding second dimension in a comparative back-to-back diode based protection circuitry that is configured for operation in higher voltage domain. Thus, the drain-ballasted ESD protection circuits described herein are relatively small in size and yet still exhibit suitable ESD performance.

In some embodiments, the first dimension 481 and/or the second dimension 482 can be less than 120 μm, less than 100 μm, less than 80 μm, less than 60 μm, or less than less than 50 μm. For instance, in some embodiments each of the first dimension 481 and/or the second dimension 482 can be less than 120 μm, less than 100 μm, less than 80 μm, less than 60 μm, or less than less than 50 μm. In some embodiments, each of the first dimension 481 and/or the second dimension 482 can be less than 120 μm. In some embodiments, each of the first dimension 481 and/or the second dimension 482 can be less than 100 μm. In some embodiments, each of the first dimension 481 and/or the second dimension 482 can be less than 80 μm. In some embodiments, each of the first dimension 481 and/or the second dimension 482 can be less than 60 μm. In some embodiments, each of the first dimension 481 and/or the second dimension 482 can be less than 50 μm.

In some embodiments, an area of the drain-ballasted ESD protection circuit 455 described herein can be on an order of about five times smaller than a corresponding second dimension in a comparative back-to-back diode based ESD protection circuit that is configured for (e.g., includes a sufficient quantity of diodes) operation in higher voltage domain. For instance, an area of the drain-ballasted ESD protection circuit 455 can be substantially equal to 1,800 $\mu m^2$, as compared to a significantly larger area (e.g., substantially equal to 7,100 $\mu m^2$) of a comparative back-to-back diode based ESD protection circuit that is configured for operation with a higher voltage domain (e.g., having a supply voltage of 1.8 volts or higher). Accordingly, the drain-ballasted ESD protection circuits herein may have significantly smaller dimensions and area than the corresponding dimensions (e.g., a vertical height of 148 μm by a horizontal width of 48 μm) and area of a comparative back-to-back diode based ESD protection circuit that is configured for operation in higher voltage domain (e.g., including at least one voltage domain with a supply voltage of 1.8 volts or higher), and yet as mentioned still yield suitable ESD protection.

Figure 5:
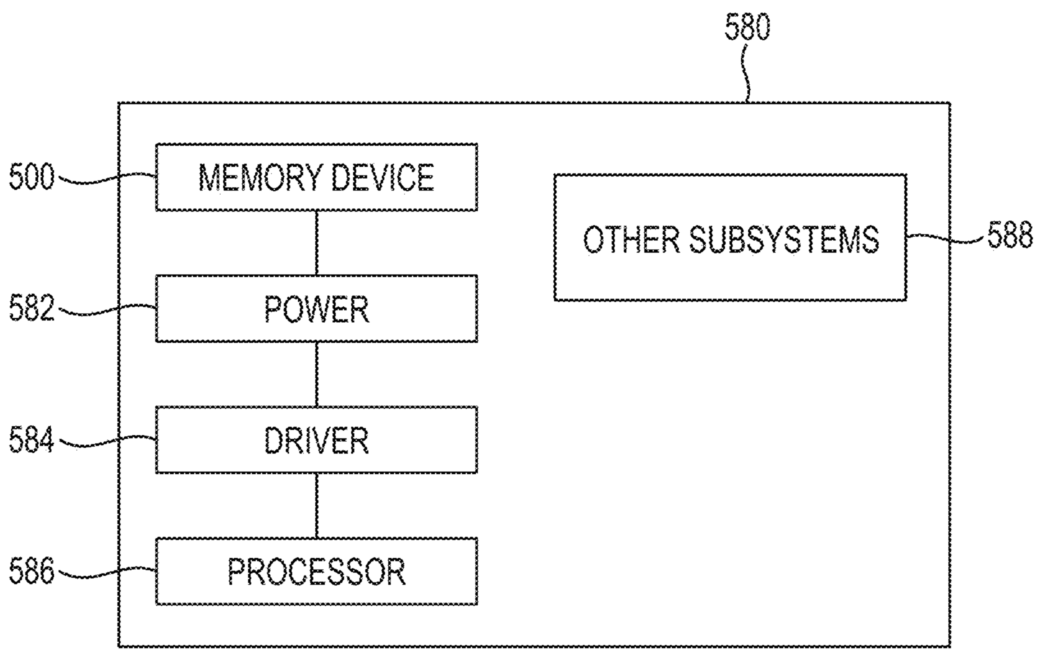
FIG. 5 is a block diagram of an example computer system that includes a memory device in accordance with some embodiments of the present disclosure.

FIG. 5 is a block diagram of an example computer system 580 that includes a memory device 500 in accordance with some embodiments of the present disclosure. Any one of the foregoing memory devices and drain-ballasted ESD protection circuits described above with reference to FIGS. 1-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588.

The memory device 500 can include features generally similar to those of the memory device and drain-ballasted ESD protection circuits described above with reference to FIGS. 1-4, and can therefore include various features for performing a direct read request from a host device. The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
- a first voltage domain including a first circuit configured to operate at a first supply voltage;
- a second voltage domain including second circuit configured to operate at a second supply voltage; and
- a drain-ballasted electrostatic discharge (ESD) protection circuit configured to electrically couple the first voltage domain and the second voltage domain, the drain-ballasted ESD protection circuit comprising:
  - a first NMOS transistor;
  - a second NMOS transistor;
  - a floating interconnect that electrically couples the first NMOS transistor to the second NMOS transistor; and
  - a resistor directly coupled to a first gate of the first NMOS transistor, a second gate of the second NMOS transistor and ground.

2. The apparatus of claim 1, wherein the first supply voltage is less than the second supply voltage.

3. The apparatus of claim 2, wherein the first supply voltage is in a range from 0.8 volts to 1.2 volts, and the second supply voltage is in a range from 1.8 volts to 2.4 volts.

4. The apparatus of claim 2, wherein the first supply voltage is substantially equal to 1.2 volts and wherein the second supply voltage is substantially equal to 1.8 volts.

5. The apparatus of claim 1, wherein the grounding resistor has a resistance that is equal to or greater than 10,000 ohms.

6. The apparatus of claim 1, wherein the drain-ballasted ESD protection circuit is configured to provide bi-directional ESD protection between the first voltage domain and the second voltage domain.

7. The apparatus of claim 1, wherein the floating interconnect electrically couples a source of the first NMOS transistor to a source of the second NMOS transistor to cause the first gate and the second gate to exhibit a coupling effect.

8. The apparatus of claim 1, wherein the second NMOS transistor is coupled in series with the first NMOS transistor.

9. The apparatus of claim 1, wherein the first circuit and the second circuit are FinFETs.

10. A system comprising:

a first voltage domain including a first FinFET transistor configured to operate at a first supply voltage;

a second voltage domain including second FinFET transistor configured to operate at a second supply voltage; and a drain-ballasted electrostatic discharge (ESD) protection circuit configured to electrically coupled to the first voltage domain and the second voltage domain, the drain-ballasted ESD protection circuit comprising:

a first NMOS transistor;

a second NMOS transistor in series with the first NMOS transistor;

a floating interconnect configured to electrically couple the first NMOS transistor to the second NMOS transistor; and a resistor directly coupled to a first gate of the first NMOS transistor, a second gate of the second NMOS transistor, and to ground.

11. The system of claim 10, wherein the first NMOS transistor and the second NMOS transistor are asymmetrically configured, wherein the drain-ballasted ESD protection circuit provides bi-directional ESD protection between the first voltage domain and the second voltage domain.

12. The system of claim 10, wherein the first supply voltage is substantially equal to the second supply voltage, and wherein:

the first supply voltage and the second supply voltage are substantially equal to 1.8 volts; or the first supply voltage and the second supply voltage are substantially equal to 2.4 volts.

13. The system of claim 10, wherein the first supply voltage is not substantially equal to the second supply voltage, and wherein:

the first supply voltage is substantially equal to 1.2 volts;

the second supply voltage is substantially equal to 1.8 volts; and the grounding resistor has a resistance that is substantially equal to 10,000 ohms.

14. The system of claim 10, wherein the drain-ballasted ESD protection circuit is electrically coupled to a first power pin of the first voltage domain and a second power pin of the second voltage domain.

15. A memory device, comprising:

a first voltage domain including:

a first power pin configured to supply a first supply voltage;

a first ground pin; and a first FinFET electrically coupled to the first power pin and the first ground pin, wherein the first FinFET is configured to operate at the first supply voltage;

a second voltage domain including:

a second power pin configured to supply a second supply voltage that is higher than the first supply voltage;

a second ground pin; and a second FinFET electrically coupled to the second power pin and the second ground pin, wherein the second FinFET is configured to operate at the second supply voltage; and a bi-directional drain-ballasted electrostatic discharge (ESD) protection circuit configured to electrically couple the first voltage domain and the second voltage domain responsive to a detection of an ESD event, the bi-directional drain-ballasted ESD circuit comprising:

a first NMOS transistor including a first source, a first drain, and a first gate;

a second NMOS transistor including a second source, a second drain, and a second gate;

a floating interconnect configured to electrically couple the first source of the first NMOS transistor to the second source of the second NMOS transistor; and a grounding resistor directly electrically coupled to the first gate, the second gate, and ground.

16. The memory device of claim 15, wherein:

the first drain is electrically coupled to the first power pin and the second drain is electrically coupled to the second power pin; and the floating interconnection is further configured to electrically couple the first source to the second source in series.

17. The memory device of claim 15, wherein the ESD event is detected based on a triggering condition that is indicative of an occurrence of the ESD event, and wherein the triggering condition is a detected voltage that satisfies a threshold voltage, a detected voltage duration that satisfies a threshold voltage duration, a detected rate of voltage change that satisfies a threshold rate of change in the voltage, or any combination thereof.

18. The memory device of claim 15, wherein:

the first voltage domain further includes a first ESD power clamp that is electrically coupled to the first power pin and the first ground pin; and the second voltage domain further includes a second ESD power clamp that is electrically coupled to the second power pin and the second ground pin.

19. The memory device of claim 15, wherein the first FinFET and the second FinFET further comprise n-type FinFETs.

* * * * *